(12) United States Patent
Sferlazzo et al.

(10) Patent No.: US 8,092,599 B2
(45) Date of Patent: Jan. 10, 2012

(54) MOVABLE INJECTORS IN ROTATING DISC GAS REACTORS

(75) Inventors: Piero Sferlazzo, Marblehead, MA (US); Alexander I. Gurary, Brigdewater, NJ (US); Eric A. Armour, Pennington, NJ (US); William E. Quinn, Whitehouse Station, NJ (US); Steve Ting, Whitehouse Station, NJ (US)

(73) Assignee: Veeco Instruments Inc., Plainview, NY (US)

( * ) Notice: Subject to any disclaimer, the term of this patent is extended or adjusted under 35 U.S.C. 154(b) by 1203 days.

(21) Appl. No.: 11/827,133

(22) Filed: Jul. 10, 2007

(65) Prior Publication Data

US 2009/0017190 A1    Jan. 15, 2009

(51) Int. Cl.
C23C 16/00 (2006.01)
C23C 16/455 (2006.01)
H01L 21/306 (2006.01)

(52) U.S. Cl. ............... 118/715; 156/345.33; 156/345.34

(58) Field of Classification Search .................. 118/715; 156/345.33, 345.34
See application file for complete search history.

(56) References Cited

U.S. PATENT DOCUMENTS

| | | | |
|---|---|---|---|
| 3,980,561 A * | 9/1976 | Miyagi et al. ................ 210/151 |
| 4,105,810 A * | 8/1978 | Yamazaki et al. ....... 427/255.32 |
| 5,372,652 A * | 12/1994 | Srikrishnan et al. ............. 134/7 |
| 5,393,232 A | 2/1995 | Haines | |
| 5,431,738 A | 7/1995 | Murakami et al. | |
| 5,588,999 A * | 12/1996 | Takahashi .................... 118/715 |
| 5,670,210 A * | 9/1997 | Mandal et al. ................ 427/240 |
| 5,843,234 A | 12/1998 | Finn et al. | |
| 5,888,303 A * | 3/1999 | Dixon ........................... 118/715 |
| 6,280,581 B1 | 8/2001 | Cheng | |
| 6,480,286 B1 | 11/2002 | Kubo et al. | |
| 6,495,010 B2 | 12/2002 | Sferlazzo | |
| 6,511,539 B1 | 1/2003 | Raaijmakers | |
| 6,669,824 B2 | 12/2003 | Sferlazzo et al. | |
| 6,812,157 B1 * | 11/2004 | Gadgil ........................... 438/763 |
| 7,094,522 B2 * | 8/2006 | Itoh et al. ...................... 430/327 |
| 7,339,656 B2 * | 3/2008 | Matsumoto et al. ............ 356/72 |

(Continued)

FOREIGN PATENT DOCUMENTS

JP    04171944 A   *  6/1992

OTHER PUBLICATIONS

International Search Report, PCT/US08/08507.

*Primary Examiner* — Jeffrie R Lund
(74) *Attorney, Agent, or Firm* — Lerner, David, Littenberg, Krumholz & Mentlik, LLP

(57) ABSTRACT

A system and method for uniform deposition of material layers on wafers in a rotating disk chemical vapor deposition reaction system is provided, wherein one or more substrates are rotated on a carrier about an axis while maintaining surfaces of the one or more substrates substantially perpendicular to the axis of rotation and facing in an upstream direction along the axis of rotation. During rotating a first gas is discharged in the downstream direction towards the one or more substrates from a first set of gas inlets. A second gas is discharged in the downstream direction towards the one or more substrates from at least one movable gas injector, and the at least one movable gas inlet is moved with a component of motion in a radial direction towards or away from the axis of rotation.

39 Claims, 13 Drawing Sheets

U.S. PATENT DOCUMENTS

| | | |
|---|---|---|
| 7,357,842 B2 * | 4/2008 | Ishikawa et al. ............... 118/503 |
| 2002/0127334 A1 * | 9/2002 | Gurer et al. .................... 427/240 |
| 2002/0176936 A1 * | 11/2002 | Matsuyama ................... 427/240 |
| 2003/0017665 A1 * | 1/2003 | Tamada et al. ................. 438/200 |
| 2004/0144309 A1 * | 7/2004 | Yudovsky ...................... 118/715 |
| 2005/0100681 A1 * | 5/2005 | Kobayashi et al. ........ 427/427.1 |
| 2006/0086460 A1 * | 4/2006 | Kitamura et al. ........ 156/345.31 |
| 2006/0127575 A1 * | 6/2006 | Matsuyama ................... 427/240 |
| 2008/0166884 A1 * | 7/2008 | Nelson et al. ................. 438/765 |
| 2009/0017190 A1 * | 1/2009 | Sferlazzo et al. ............... 427/10 |
| 2009/0068849 A1 * | 3/2009 | Endo et al. ..................... 438/763 |
| 2009/0081366 A1 * | 3/2009 | Kerr et al. ................. 427/255.28 |
| 2009/0081886 A1 * | 3/2009 | Levy et al. ..................... 438/790 |
| 2009/0130858 A1 * | 5/2009 | Levy .............................. 438/765 |
| 2009/0217878 A1 * | 9/2009 | Levy et al. ..................... 118/729 |
| 2009/0280649 A1 * | 11/2009 | Mayer et al. ................... 438/676 |
| 2010/0020297 A1 * | 1/2010 | Inatomi ............................ 355/30 |
| 2010/0170641 A1 * | 7/2010 | Jorgensen ................ 156/345.33 |
| 2010/0285209 A1 * | 11/2010 | Tateishi .......................... 427/72 |

* cited by examiner 2B-2B

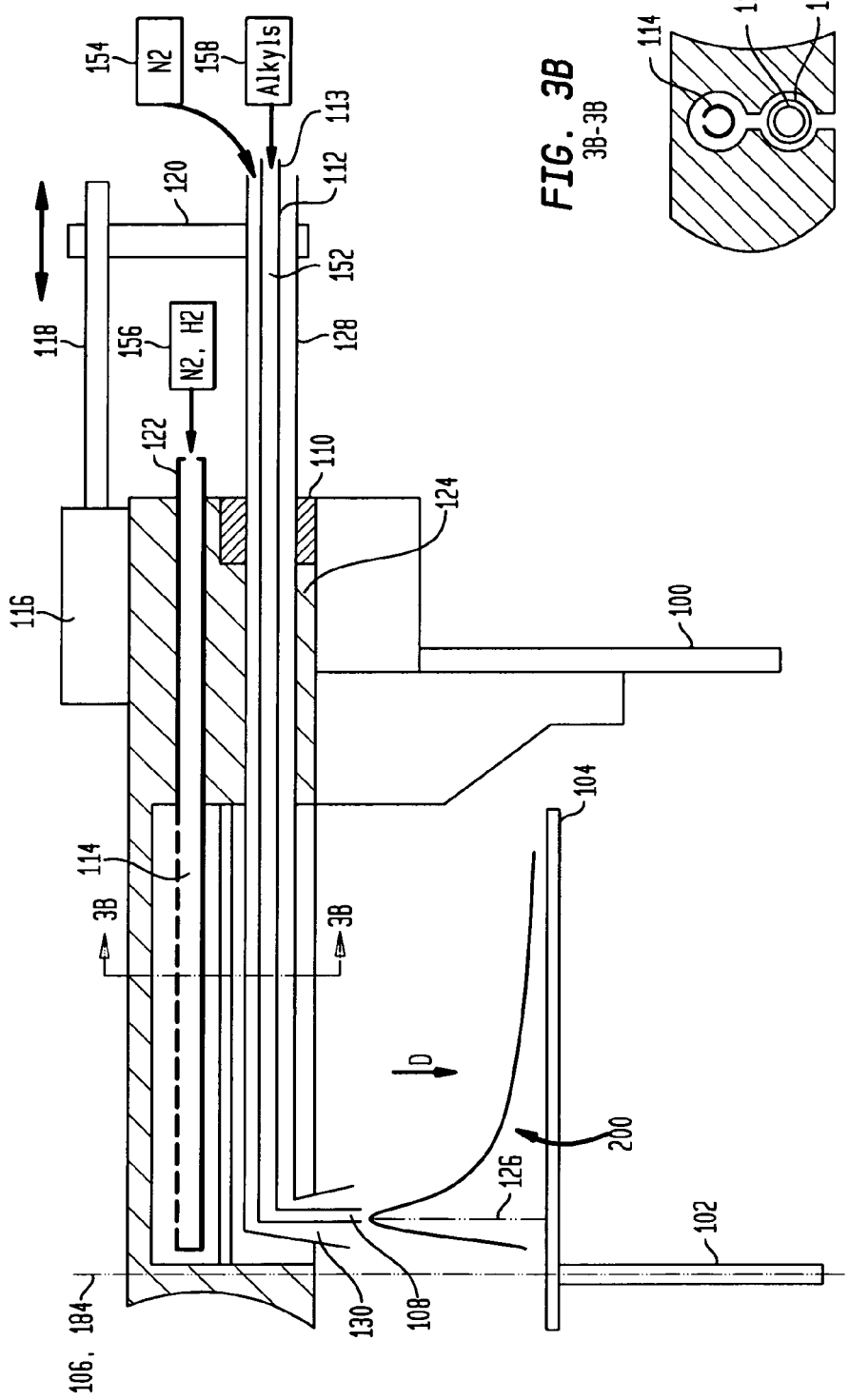

4B-4B

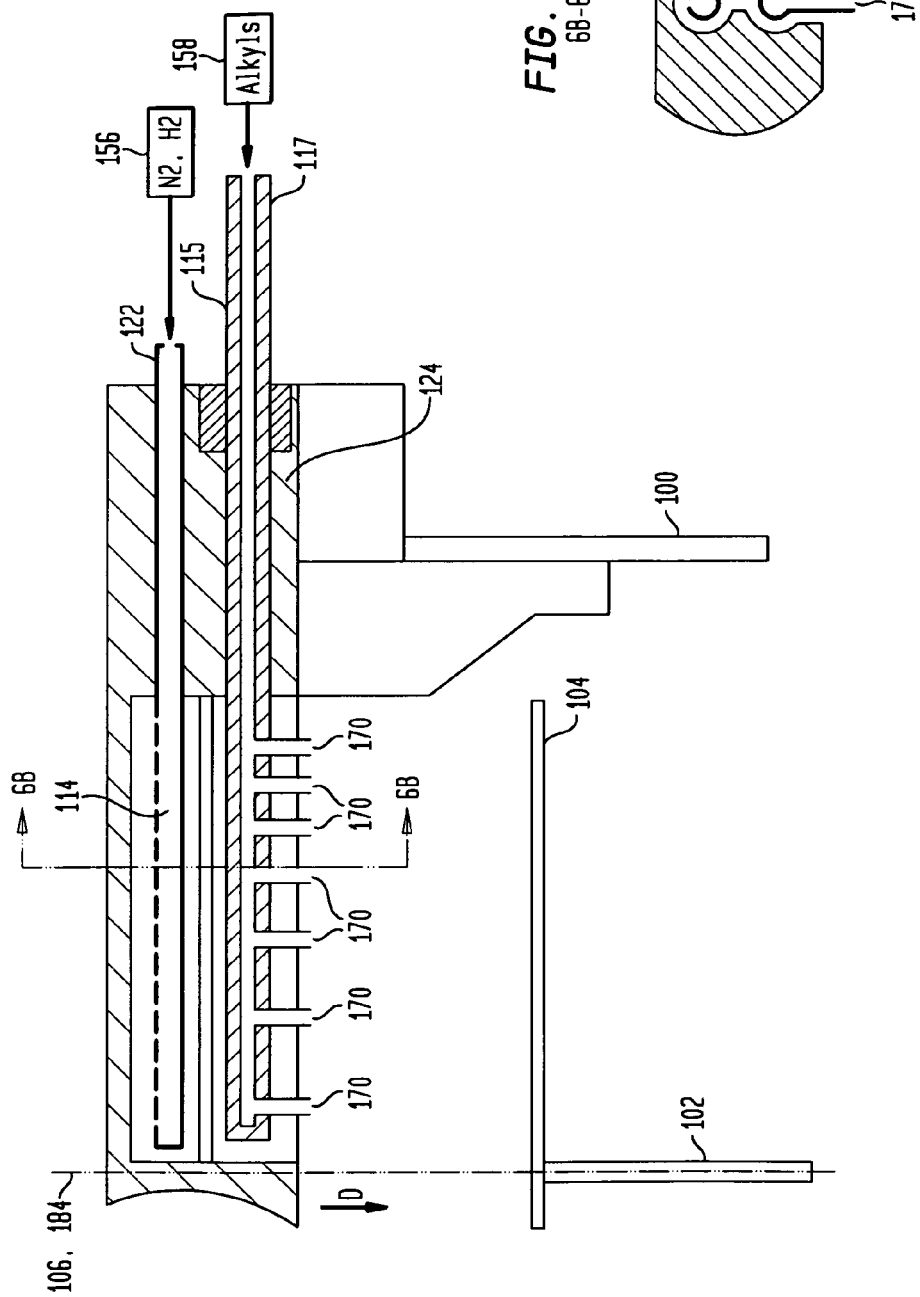

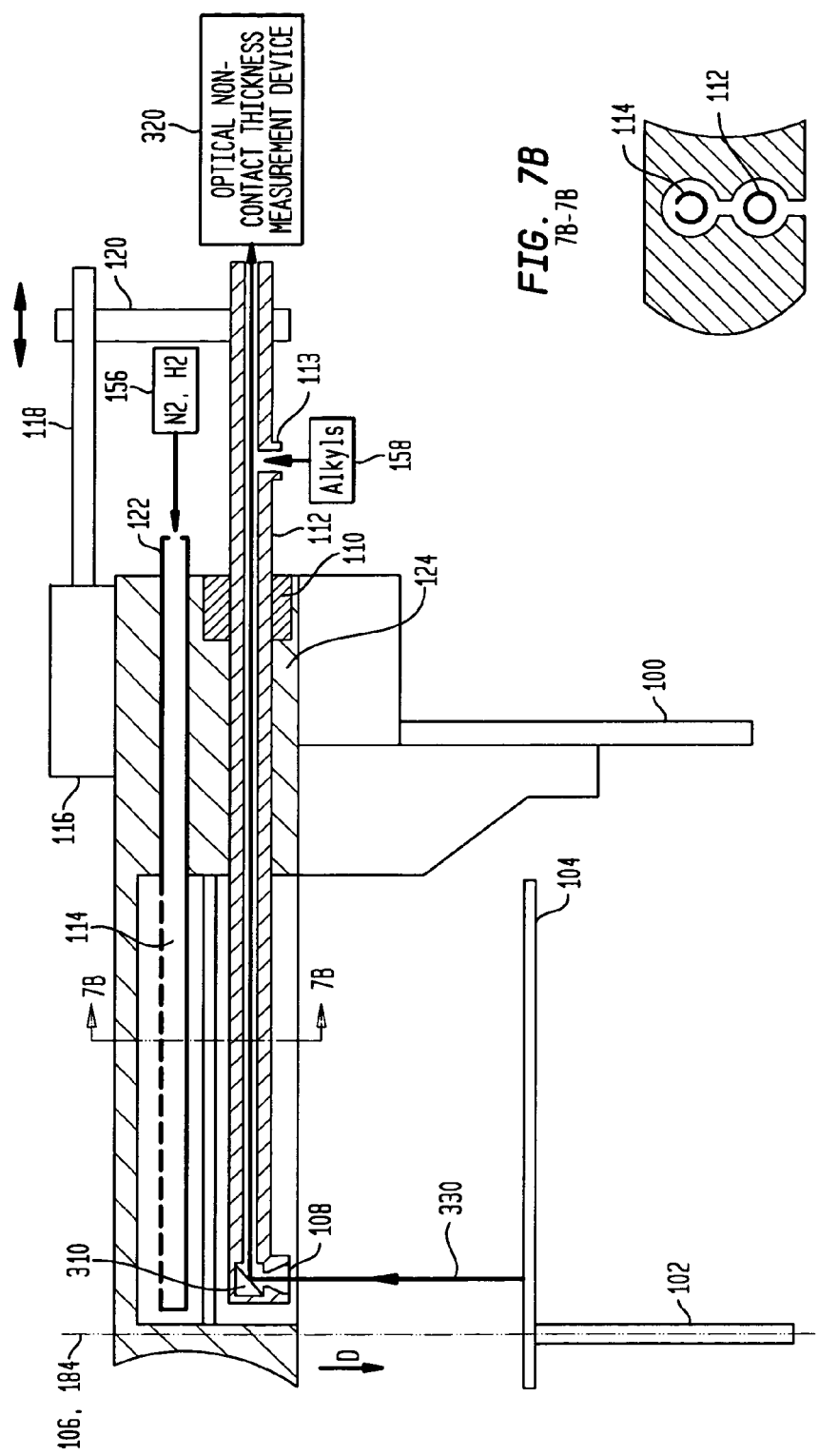

MOVABLE INJECTORS IN ROTATING DISC GAS REACTORS

BACKGROUND OF THE INVENTION

Gas treatment apparatus such as chemical vapor deposition systems are used to treat substrates such as semiconductor wafers. One form of apparatus commonly used is a rotating disk reactor. Such a reactor includes a chamber and a disk-like substrate carrier mounted within the chambers. Substrates such as wafers are disposed on the carrier, and the carrier is rotated about its axis. A component referred to as a gas distribution injector or "injector head" is mounted in fixed position on the chamber. The gas injector head typically includes numerous gas inlets. One or more reactive gases are injected into the chamber through these inlets and flow generally in a downstream direction toward the substrate carrier, and outwardly across the rotating substrate carrier and the surfaces of the substrates disposed on the carrier. Carrier gases may be injected along with the reactive gases.

As the gases pass across the surfaces of the wafers, they react and deposit materials on the wafer surfaces. Merely by way of example, such processes can be used to form compound semiconductors, for example, various layers of compound semiconductors. For example, numerous layers of III-V semiconductors such as gallium nitride, indium nitride, gallium arsenide, indium phosphide and gallium antimonide and the like can be deposited onto a substrate to form electronic devices such as diodes and transistors and optoelectronic devices such as light-emitting diodes and semiconductor lasers. II-VI semiconductors can be deposited by similar processes.

Small differences in the properties of each layer can profoundly affect the performance of the resulting device. The properties which can affect performance include thickness, composition, doping and impurity concentration, crystalline quality and atomic interface abruptness. Therefore, considerable effort has been devoted in the art towards development of apparatus and methods which promote uniform deposition across the entire surface of the wafer carrier. Rotation of the wafer carrier helps assure that the deposition will be uniform in the circumferential direction, around the axis of rotation of the carrier. To assure uniformity in the radial direction along the carrier surface perpendicular to the axis, the gas inlets carrying each of the reactive gases typically are subdivided into a plurality of zones. For example, the gas inlets for a particular gas may be subdivided into several zones in the form of rings concentric with the axis of rotation. The gas flow to each zone may be controlled independently of the other zones. It is possible to select a set of gas flows for the various zones which will provide very nearly uniform distribution across the entire extent of the substrate carrier and thus the entire extent of each substrate or wafer processed.

However, still further improvement would be desirable.

SUMMARY OF THE INVENTION

One aspect of the invention provides methods of treating substrates. A method according to this aspect of the invention desirably includes the step of rotating the substrates about an axis of rotation while maintaining surfaces of the substrate substantially perpendicular to the axis of rotation and facing in an upstream direction along the axis of rotation. The method desirably further includes the step of discharging a first gas with a component motion in a downstream direction toward the substrate from at least one first movable gas inlet. The method most preferably further includes the step of moving the at least one first movable gas inlet with a component of motion in a radial direction towards or away from the axis of rotation. The method may further include the step of discharging a second gas with a component of motion in the downstream direction toward the substrates. Numerous factors, including the flux of first gas through the first movable gas inlet and the speed of motion of the first movable gas inlet, can be controlled so as to control the rate of reaction as, for example, the rate of deposition in a chemical vapor deposition reaction, as well as the composition of the deposited material.

A further aspect of the invention provides an injector head for a rotating disk gas treatment reactor. The injector head desirably includes a body having a central axis, the body being arranged for mounting to the reactor with the central axis aligned with the axis of rotation of the substrate carrier in the reactor; a structure defining a first set of gas inlets facing in a downstream direction; at least one movable gas inlet facing in a downstream direction; and, a drive adapted for moving the at least one movable gas inlet with a component of motion in a radial direction towards or away from the central axis.

Yet another aspect of the invention provides a rotating disk gas reactor for treating one or more substrates. The reactor according to this aspect of the invention desirably includes a reaction chamber and a carrier mounted within the chamber for rotation therein about an axis of rotation. The carrier is adapted to carry one or more substrates, most typically a plurality of substrates. The reactor desirably also includes a carrier drive for rotating the carrier around the axis of rotation, at least one first movable gas inlet for discharging a first gas with a component of motion in the downstream direction towards the substrates on the carrier and an inlet drive for moving the at least one first movable gas inlet with a component of motion towards and away from the axis of rotation.

BRIEF DESCRIPTION OF THE DRAWINGS

FIG. 3A is a view similar to FIG. 2A but depicting a further embodiment of the present invention.

FIG. 3B is a partial cross-sectional view taken along line 3B-3B in FIG. 3A.

FIG. 6A is a partial cross-sectional view depicting a further embodiment.

FIG. 6B is a partial cross-sectional view along line 6B-GB in FIG. 6A.

FIG. 7A is a partial cross-sectional view of a further embodiment of an injector head used in the reactor of FIG. 1 with an optical measurement device.

FIG. 7B is a partial cross-sectional view along line 7B-7B in FIG. 7A.

DETAILED DESCRIPTION

Figure 1:
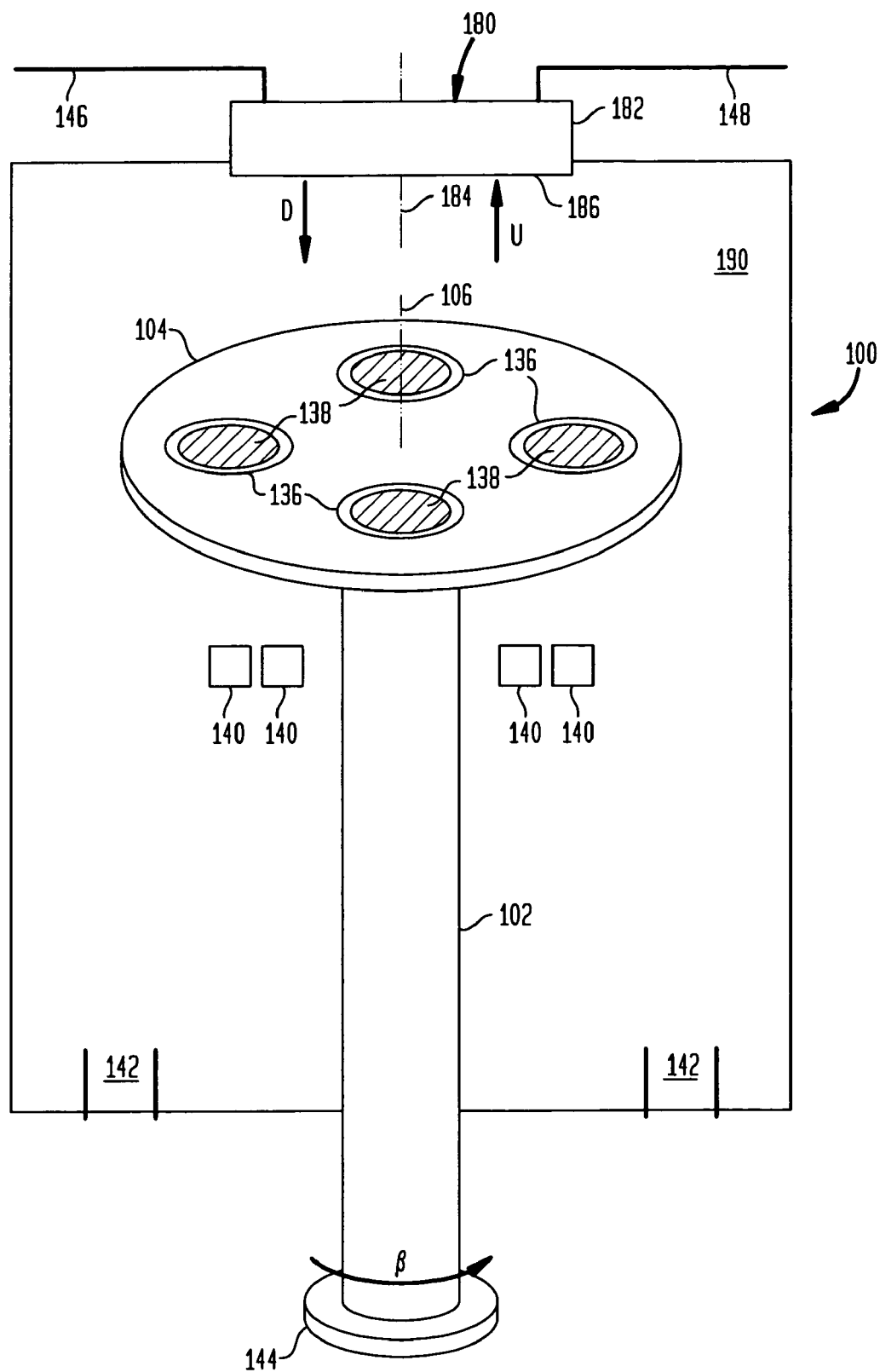
FIG. 1 is a diagrammatic, partially perspective representation of one embodiment of a rotating disk gas treatment reactor of the present invention.

While the present invention is particularly well suited for use in MOCVD (metalorganic chemical vapor deposition) rotating disk reactors and is so described herein, it is equally well suited for other rotating disk gas treatment systems. MOCVD is a method of epitaxial growth of materials, especially semiconductors from the surface reaction of metalorganics and metal hydrides containing the required chemical elements. For example, indium phosphide can be grown by introducing trimethylindium $(CH_3)_3In$ and phosphine $PH_3$. Alternate names for this deposition process include metalorganic vapor phase epitaxy (MOVPE), organometallic vapor phase epitaxy (OMVPE), and organometallic chemical vapor deposition (OMCVD).

The rotating disk gas treatment reactor is a chamber which can withstand high temperatures and has an interior which does not react with the chemicals being used. The chamber contains a rotating susceptor (substrate carrier), gas injection modules, and temperature control systems. To prevent overheating of the reactor the injector head and reactor walls contain channels for water cooling. The wafers or substrates sit on a susceptor which maintains a controlled temperature. Formation of the epitaxial layer occurs by a change caused by heat to the constituent chemicals (pyrolysis) on the wafer surface and is the dominant process for manufacturing laser diodes, solar cells, LEDs and other semiconductor devices.

Pressure within the rotating disk gas treatment reactor chamber in controlled as is the speed of rotation of the susceptor. A carrier gas, such as nitrogen (N2) or hydrogen (H2), is bubbled through a metalorganic liquid and the carrier gas picks up metalorganic vapor which is transported into the reactor chamber. The temperature of the metalorganic liquid and carrier gas as well as the flow rate affect the amount of metalorganic vapor that is transported. Rotating disk gas treatment reactor chamber exhaust gas is collected and processed to minimize waste product products.

A rotating disk gas treatment reactor 100 according to one embodiment of the invention (FIG. 1) includes a reaction chamber 190 and a generally disc like substrate carrier 104 disposed therein. The substrate carrier 104 includes a plurality of substrate compartments 136 in which a plurality of substrates such as wafers 138 are placed. The substrate carrier 104 is heated by heating elements 140. The substrate carrier 104 is seated on a spindle 102 having an axis of rotation 106. The surfaces of the wafers 138 to be treated face in an upstream direction U toward the top of the drawing in FIG. 1. The reactor 100 further includes exhaust outlets 142 and a drive motor 144 for rotating the spindle 102 and substrate carrier 104 placed thereon around axis of rotation 106 at a rate ($\beta$). The rate of rotation $\beta$ is typically about 50 RPM to about 2000 RPM.

An injector head 180 is mounted to chamber 190 at its upstream end. As further discussed below, the injector head 180 provides one or more reaction gases 146, 148 to the reaction chamber 190 for deposition processes to be performed on the substrates 138. The injector head 180 includes a body 182 which is adapted for mounting to chamber 190 of the reactor 100 so that a central axis 184 is coincident with axis of rotation 106 and so that a downstream surface 186 of the body faces in a downstream direction D, toward the substrate carrier 104. As best seen in FIG. 2C, the injector head 180 includes fixed first gas inlets 170 and fixed second gas inlets 172 mounted in fixed positions on body 182. The fixed gas inlets 170 & 172 are open to the downstream surface 186 of the body 182. In the particular embodiment depicted, the fixed first gas inlets 170 are arranged in rows extending generally radially with respect to the central axis 184, whereas the fixed second gas inlets 172 are disposed in regions between these rows. The fixed first gas inlets 170 may be subdivided into a plurality of zones 170a, 170b, 170c lying at different radial distances from central axis 184, whereas the fixed second gas inlets 172 may be subdivided into a plurality of zones 172a, 172b, 172c at different radial distances from the central axis 184. The injector head 180 desirably includes separate passages (not shown) connected to the inlets of each radial zone, so that the inlets of each radial zone may be connected to a separately-controllable source of first or second gas. Those regions of the injector head carrying the fixed inlets 170, 172 may be configured generally as shown in commonly assigned U.S. Pat. No. 6,197,121 and in U.S Patent Publication No. US20060021574A1, the disclosures of which are hereby incorporated by reference herein.

Figure 2A:
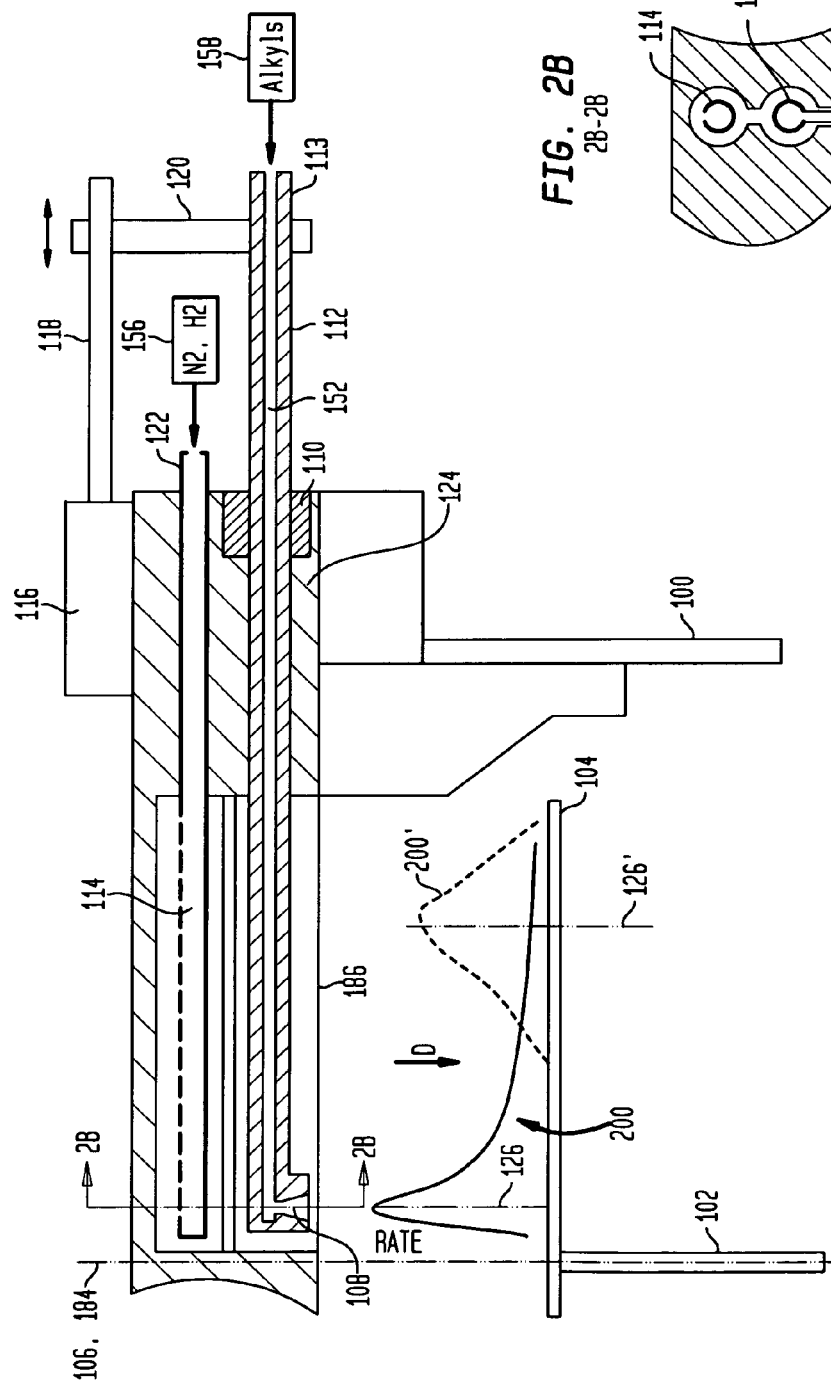
FIG. 2A is a partial cross-sectional view of an injector head used in the reactor of FIG. 1.
Figure 2B:
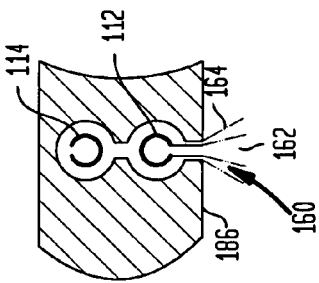
FIG. 2B is a partial cross-sectional view taken along line 2B-2B in FIG. 2A.
Figure 2C:
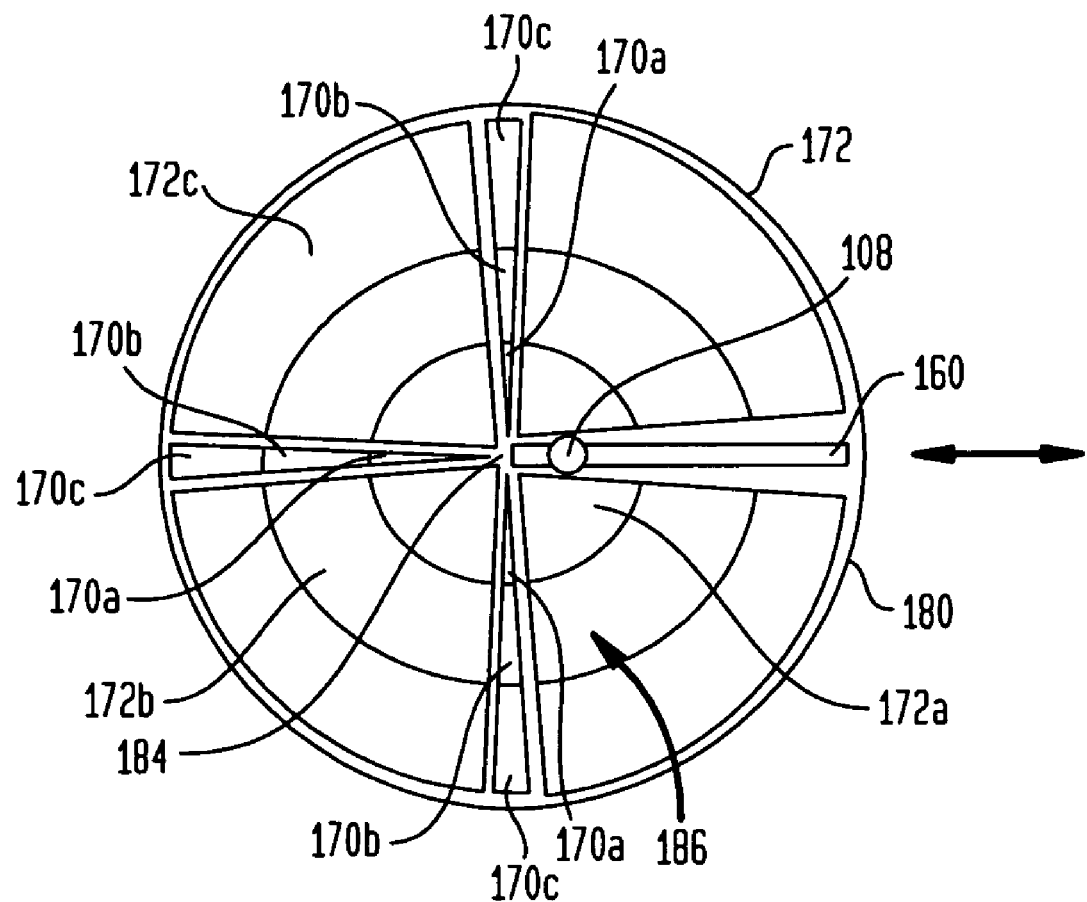
FIG. 2C is a diagrammatic bottom view of the injector head of FIG. 2A.

As shown in FIGS. 2A-2C, the injector head body 182 defines a slot 160 extending radially towards and away from central axis 184. The slot is open to the downstream surface 186 of the body 182. The injector head assembly 180 further includes a first movable gas inlet (injector) 108 which is positioned within slot 160. The movable gas inlet 108 has an opening facing in the downstream direction D. 108 is mounted on a first gas supply tube 112 having inlet 113. The first gas supply tube 112 is disposed within slot 160. Inlet 113 is connected to a controllable source 158 of a first gas. A linear vacuum seal 110 positioned in body 182 permits supply tube 112 to move slidably therein. Supply tube 112 is fixed to a drive plate 120. A linear drive 116 with controllable speed is adapted to move linear shaft 118 back and forth at a controlled speed. The linear shaft 118 is coupled to drive plate 120, so that linear drive 116 can move the supply tube 112 and movable gas inlet 108 back and forth along slot 160.

Push flow inlets (push flow injectors) 114 are disposed within slot 160. The push flow inlets 114 are disposed upstream of the movable gas inlet 108, i.e., further from downstream surface 186. The push flow inlets 114 are in fluid communication through a push flow supply tube 122 with a push gas source 156.

In a method according to an embodiment of the invention, the reactor of FIGS. 1-2C is used to perform a metalorganic chemical vapor deposition process (MOCVD) on substrates 138, so as to deposit a III-V compound semiconductor thereon. Drive motor 144 is actuated to rotate spindle 102 and substrate carrier 104 about axis of rotation 106. Heating elements 140 bring the carrier 104 and substrates 138 to an elevated temperature, most commonly about 350° C. to about 1600° C. While the carrier 104 and substrates 138 are maintained at this elevated temperature and maintained in rotation, a first gas is supplied through the fixed first gas inlets 170 and a second gas is supplied through the second fixed gas inlets 172. In this deposition process, the first gas includes one or more organometallic compounds, most typically metal alkyls selected from the group consisting of gallium, indium and aluminum alkyls, in admixture with a carrier gas such as nitrogen or hydrogen. The second gas includes one or more hydrides of a group V element, such as ammonia or arsine, and which may also include one or more carrier gasses. The first and second gasses flow generally in the downstream direction D from injector head 180 to carrier 104. The gasses pass across the surfaces of the substrates 138 and carrier 104, and flow downstream to gas outlets 142. As the gasses pass over the substrates 138, they react and form the desired III-V semiconductor on the exposed surfaces of the substrates. One or both of the first and second gasses may also include one or more dopants which are incorporated into the semiconductor.

During the steps discussed above, one or more carrier gasses such as nitrogen or hydrogen is supplied as a push gas flow from source 156 through push gas inlets 114 so that the push gas flow issues from slot 160. At the same time, source 158 is operated to supply a flow of the first gas through movable first gas inlet 108, and linear drive 116 is operated to move the movable gas inlet 108 along slot 160, generally radially with respect to the axis of rotation 106. For example, movable gas inlet 108 may operate at linear speeds, in the inward and outward directions, ranging from stationary to approximately 9 inches per second, most typically from stationary to 3 inches per second or 4 inches per second.

The push gas flow from inlets 114 passes around supply tube 112 and around the exterior of movable gas inlet 108. Thus, as schematically depicted in FIG. 2B, the flow 162 of first gas is surrounded by a flow 164 of push gas. This push gas flow tends to isolate the first gas from the second gas issuing from fixed second gas outlets 172 (FIG. 2C) disposed adjacent slot 160. Such isolation tends to suppress premature reaction of the first and second gasses and unwanted deposition on the movable gas inlet 108.

The first gas supplied through movable gas inlet 108 passes downstream along with the push gas flow to the carrier 104 and substrates 138, so that this additional first gas participates in the reaction to form the semiconductor. At any given time, the first gas flow issuing from the movable gas inlet 108 is concentrated at the radial location of the first gas inlet. The rate at which the first gas in this flow tends contributes to formation of the semiconductor depends on the location of the movable gas inlet 108. For example, curve 200, referred to as a resonance curve, represents a plot of the rate at which the first gas flowing from the gas inlet 108 disposed at the position depicted in solid lines in FIG. 2A participates in the reaction at various radial positions on the carrier 104. With the movable gas inlet 108 in this position, the peak or maximum contribution occurs at a radial position 126 corresponding to the radial position of the movable gas inlet 108. The rate of contribution is substantially lower at radial positions inboard of position 126 (closer to axis 102) and far outboard of position 126. As the position of the movable gas inlet 108 changes, the resonance curve 200 also changes. For example, a resonance curve 200' depicted in broken lines shows the rate at which the first gas issuing from inlet 108 disposed at position 126', shown in broken lines, will participate in the reaction.

By varying the amount of push gas for a fixed amount of first gas flowing through movable outlet 108, the profile of the resonance curve 200 can be changed without changing the flux of the first gas that is injected. Also, the height of the resonance curve for each position varies directly with the flux of first gas through the movable outlet. Also, by varying the speed of motion of the movable gas inlet 108, the speed with which the resonance curve 200 changes can be regulated. Any or all of these factors can be used to control the aggregate reaction rate over time at various radial locations.

Typically, the flows through the fixed gas inlets 170, 172 are selected to provide a rate of reaction which is as nearly uniform as practicable over the entire radial extent of the substrate carrier. However, because there are only a finite number of zones of fixed gas inlets 170, 172, there typically are some slight non-uniformities. As further discussed below, the conditions applied to the movable gas inlet 108 can be used to counteract these non-uniformities.

In a further embodiment (not shown) slot 160 and the movement path of movable gas inlet 108 extend across the central axis 184 and hence across the axis of rotation 106, In another embodiment, the path of motion of the movable gas inlet 108 can also be aligned such that the path of motion has a component of motion that is radial to the axis of rotation 106 but the path of motion is not radial to the axis of rotation 106.

In a further embodiment as shown in FIGS. 3A & 3B a separation flow inlet 130 is coaxial with the movable gas inlet. Components that are similar to those in the embodiment shown in FIGS. 2A, 2B & 2C are numbered the same. A separation flow inlet 130 is positioned to surround the movable gas inlet 108. The separation flow inlet 130 moves when the movable gas inlet 108 moves. The separation flow inlet 130 is in fluid communication through a separation flow supply tube 128 with a separation flow gas source 154 such as nitrogen, hydrogen or a combination. The separation flow gas is supplied by the separation flow inlet 130 with a component of motion in the downstream direction. The separation flow gas tends to isolate the first gas discharged from the movable gas inlet 108 from the second gas issuing from fixed second gas outlets 172 disposed adjacent slot 160. Such isolation tends to suppress premature reaction of the first and second gasses and unwanted deposition on the movable gas inlet 108, thereby reducing parasitic deposition, increasing efficiency and improving repeatability. Although the separation flow inlet 130 is shown as a round shape, with the movable gas inlet 108 positioned coaxial within the separation flow inlet, various geometric configurations and shapes may be employed.

The linear vacuum seal 110 positioned in injector head body 182 permits the separation flow supply tube 128 and the first gas supply tube 112 positioned coaxially within to move slidably therein. The separation flow supply tube 128 is fixed to a drive plate 120.

Figure 4A:
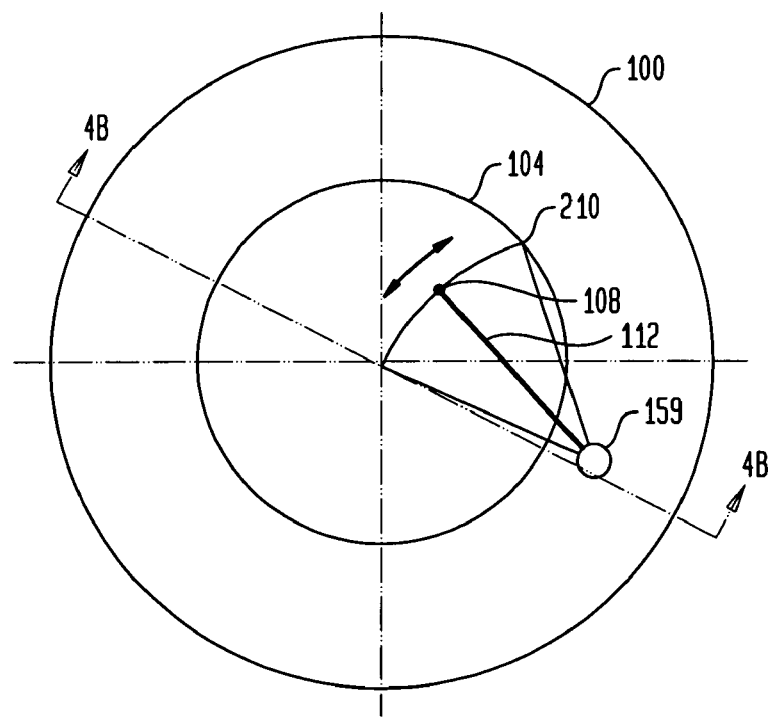
FIG. 4A is a top view of a further embodiment of the present invention with arc movement.
Figure 4B:
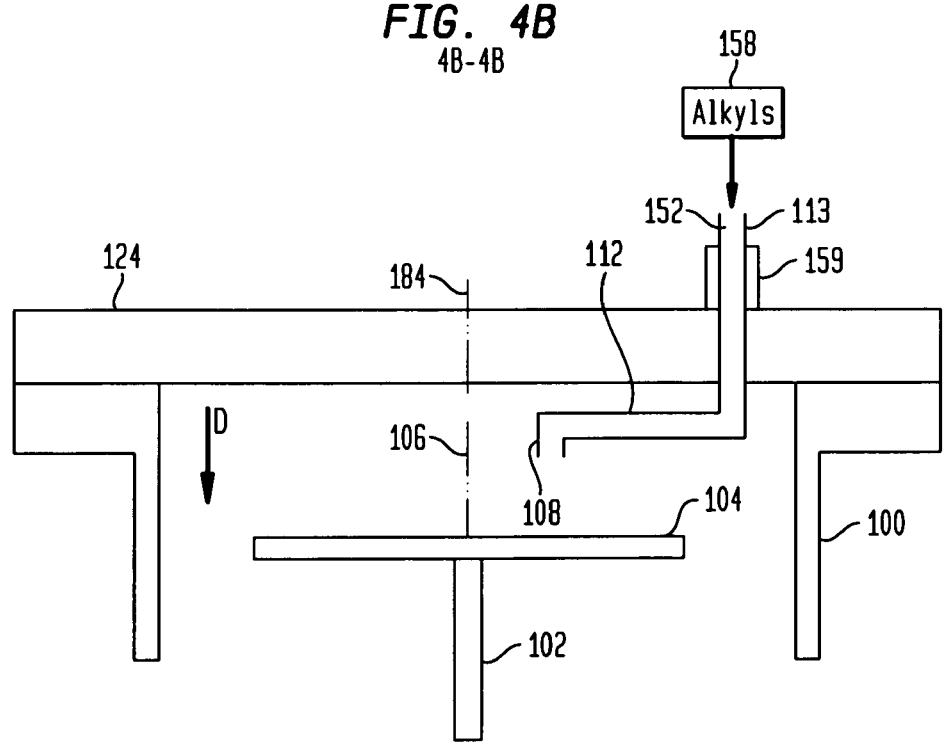
FIG. 4B is a partial cross-sectional view taken along line 4B-4B in FIG. 3A.

In a further embodiment as shown in FIGS. 4A & 4B the movable gas inlet 108 is moved in an arc movement above the substrate carrier 104. Components that are similar to those in the embodiment shown in FIGS. 2A, 2B & 2C are numbered the same.

The movable gas inlet 108 is coupled to the first gas supply tube 112 which is in fluid communication with the first gas source 158. A rotary vacuum seal 159 is mounted to the reactor top flange 124. A rotary drive with controllable speed (not shown) is adapted to rotate the first gas supply tube 112 which passes through the rotary vacuum seal 159. This thereby moves the movable gas inlet 108 in an arcuate movement, back and forth along a sweep path 210. Typically, the speed of movement range from stationary to approximately 9 inches per second.

Although the movable gas inlet 108 is shown with a path of motion 210 which approaches the central axis 184, the path of motion 210 in various other embodiments can extend through the central axis 184 and towards the other side of the rotating disk reactor 100. In a further embodiment the movable gas inlet 108 can be aligned to have a component of motion towards the axis of rotation 106 but not have a path of motion 210 that intersects the central axis 184.

Figure 5A:
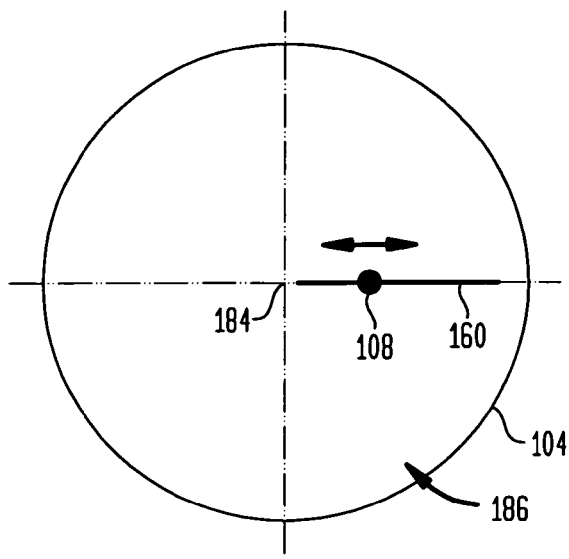
FIG. 5A is a diagrammatic bottom view of an embodiment of an injector head with a single moveable gas inlet.
Figure 5B:
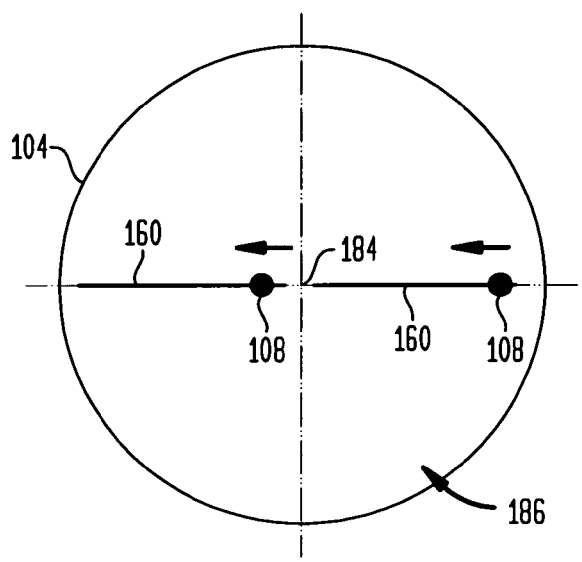
FIG. 5B is a diagrammatic bottom view of a further embodiment of the injector head with dual moveable injectors.
Figure 5C:
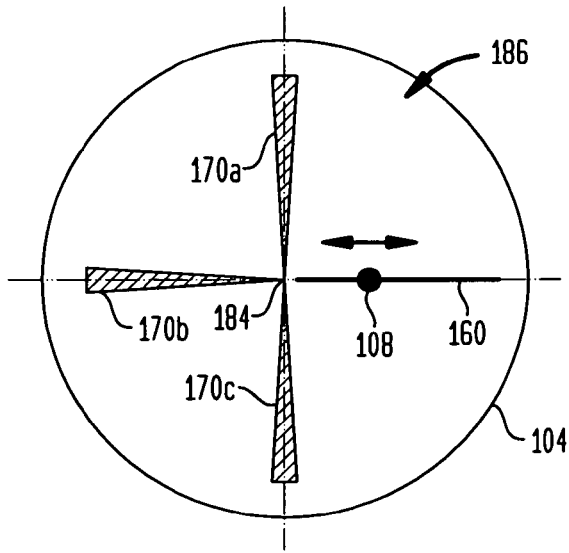
FIG. 5C is a diagrammatic bottom view of a further embodiment of the injector head with a single moveable gas inlet and multiple fixed gas inlets.

Various embodiments include various configurations of one or more first gas inlets, which may be fixed as well as movable. An embodiment with a single movable first gas inlet 108 is seen in bottom view looking at the downstream surface of the injector head assembly is shown in FIG. 5A. In this embodiment, the first gas is supplied through only a single movable first gas inlet 108. Thus, the deposition growth rate is relatively slower. To overcome this several movable first gas inlets 108 can be used as shown in FIG. 5B or a combination of movable first gas inlets 108 and fixed first gas inlets 170 can be used as shown in FIG. 5C. Various other configurations and geometries of movable first gas inlets 108 and fixed first gas inlets 170 (FIG. 2C) can be used.

In further variants, during operation of the reactor 100, a combination of several movable gas inlets 108 can be employed and may discharge different or the same gases. For example, in a chemical vapor deposition (CVD) process, the injector head can be configured to supply the first gas, such as alkyls from one of the moveable gas inlets 108, hydrides from another of the moveable gas inlets 108 and dopants from yet another of the moveable gas inlets 108.

An exemplary embodiment of the multiple fixed first gas inlets shown in FIG. 5C as well as in FIG. 2C is shown in FIGS. 6A and 6B. Components that are similar to those in the previous embodiment are numbered the same.

The injector head assembly has fixed first gas inlets 170, with an opening facing in the downstream direction D, are coupled to a fixed first gas supply tube 117. Inlets 170 are depicted in FIG. 6A as tubes projecting downstream from gas supply tube 117. In a further variant, inlets 170 may be provided as holes extending through the wall of tube 117 on the side of the tube facing downstream. A first gas source 158 is in fluid communication with the fixed first gas inlets 170 through the fixed first gas supply tube. The flow of the first gas from the fixed first gas inlets 170 has a component of motion in the downstream direction D.

Push flow inlets 114 are in fluid communication through with a push flow supply tube 122 through which a push gas flows. The flow of the first gas from the fixed first gas inlets 170 is surrounded by a flow of push gas. This push gas flow tends to isolate the first gas from the second gas issuing from fixed second gas inlets, which tends to suppress premature reaction of the first and second gasses and unwanted deposition on the fixed gas inlets 170. In the arrangement of FIG. 6A, the fixed first gas inlets are more closely spaced along tube 117 in the region of the injector head which is aligned with the periphery of the rotating substrate carrier. This closer spacing compensates for the greater surface area of the substrate carrier and substrates adjacent the periphery of the substrate carrier.

An embodiment of the present invention with an optical measurement device is shown in FIGS. 7A and 7B. Components that are similar to those in the embodiment shown in FIGS. 2A, 2B & 2C are numbered the same.

This embodiment has a mirror 310 which is movable relative to the head and an optical measurement device 320 arranged to observe the substrates through the mirror. In the embodiment of FIG. 7A, mirror 310 is mounted to the movable first gas supply tube 112, so that the mirror moves along with the movable first gas injector 108. Also, in this arrangement, the mirror 310 is disposed within tube 112, and is in optical communication with measurement device 320 through the interior of tube 112. Mirror 310 is in optical communication with the substrates through the opening of injector 108. A beam of light is supplied by an optical non-contact measurement device 320 and is directed along an optical path 330 within tube 112, towards reflector 310 and to the surface of the substrate. The beam of light is reflected from the substrate surface back along the optical path 330 to a detector incorporated in the optical non-contact measurement device 320. The reflector 310 is configured and positioned such that the reflector 310 and thus the beam of light reflected onto the substrate surface moves along with the movement of the movable first gas inlet 108.

The detector provides a signal which is used to calculate substrate growth rate, substrate composition and absolute reflectivity of the substrate. By determining the radial position r of the optical path 330 at any given time t and the absolute reflectance R, the absolute reflectance function R(r,t) can be determined and the substrate growth rate and substrate composition calculated as a function of radial position r.

Examples of an optical measurement device are disclosed in U.S. Pat. No. 6,349,270 entitled "Method And Apparatus For Measuring The Temperature Of Objects On A Fast Moving Holder," and U.S. Pat. No. 6,492,625 entitled "Apparatus And Method For Controlling Temperature Uniformity Of Substrates," the disclosures of which are incorporated by reference herein as if fully set out.

Figure 8:
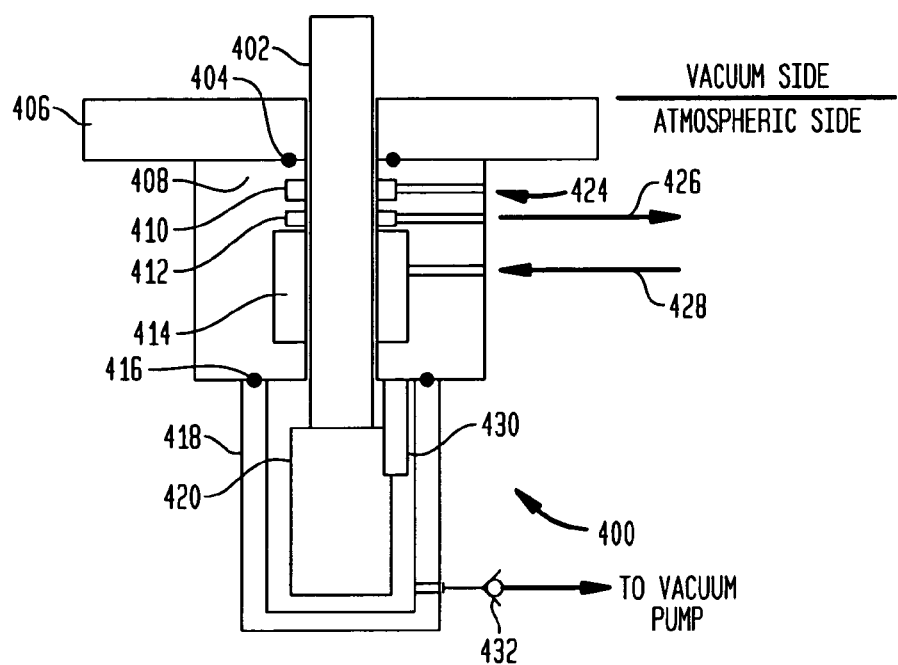
FIG. 8 is a cross-sectional view of a gas bearing.

A gas bearing assembly is shown in FIG. 8 for use with the movable first gas inlet. The gas bearing 400 can be used with linear motion as well as rotary motion of a shaft or tube 402.

A seal between the reactor wall 406 and the gas bearing body housing 408 is provided by O-ring 404. Other types of seals may also be employed. A drive motor (linear drive, rotary drive or combined linear/rotary drive) 420 is mounted to the gas bearing body 408 by flange 430. Alternately the drive motor 420 can be mounted to the vacuum tight drive enclosure 418 with the flange 430. A purge channel 410 enables any reactant gas loses (leakage) from the reactor to be extracted through a purge access port 424. A vacuum groove 412 is in fluid communication with a vacuum pump through access port 426. A gas supply inlet port 428 is in fluid communication with a gas bearing body 414 made of material porous to the gas. There is a small gap between the shaft or tube 402 and the gas bearing body 414 which provides for a limited flow of the supply gas from the gas supply inlet 428 to the vacuum groove 412, whereby the shaft or tube 402 can move in a linear and or rotary motion within the gas bearing body 414. A seal between the gas bearing body housing 408 and the vacuum tight enclosure 418 is provided by an O-ring 416. Other types of seals may also be employed. The vacuum tight enclosure 418, which houses the drive 420, is connected to a pressure relief valve 432. A compatible supply gas such as N2, H2 or a combination is provided to the gas supply inlet 428.

Figure 9A:
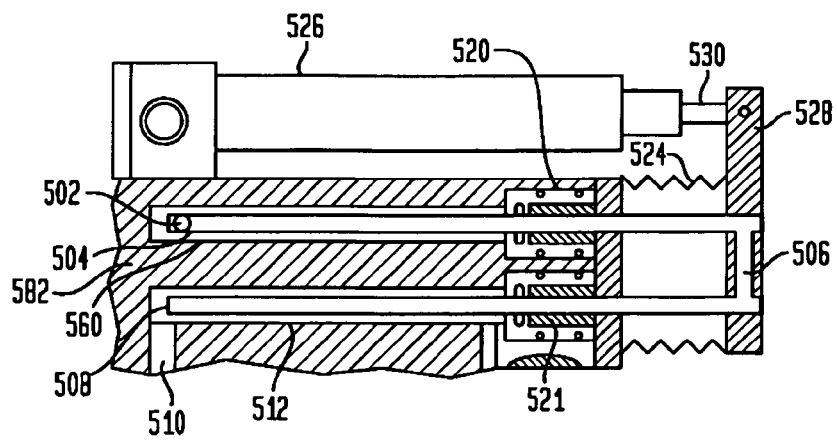
FIG. 9A is a partial cross-sectional view of an embodiment with a sliding tube coupling for the movable gas inlet.
Figure 9B:
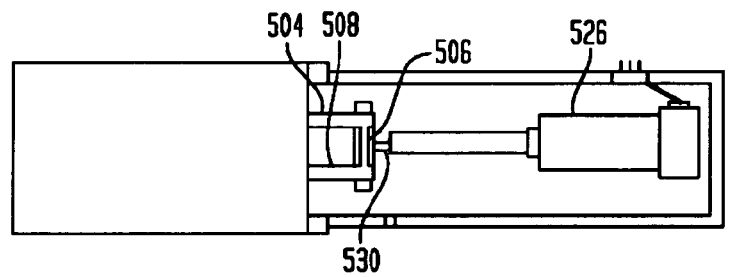
FIG. 9B is a partial cross-sectional view of an alternate configuration of the sliding tube coupling of FIG. 9A.

A slidable connection to a gas supply tube is shown in FIGS. 9A and 9B. A movable gas inlet 502 is disposed in a slot 560 within the body 582 of the injector head. Only a portion of body 582 is depicted in FIGS. 9A and 9B. As discussed above, the slot 560 is open to the downstream face of the injector head. Inlet 502 is attached to a movable gas supply inlet tube 504. The movable gas supply inlet tube 504 passes through a first gas bearing 520 and is connected to a gas connection 506 which is attached to a drive plate 528. The gas connection 506 is connected to a sliding gas supply tube 508 which passes through a second gas bearing 521. Supply tube 508 is received in a bore 512 in body 582. Bore 509 extends parallel to slot 560. However, bore 512 is not open to the downstream face of the injector head. Tube 508 has an open end disposed in bore 512. A gas inlet port 510 is in fluid communication with the movable gas inlet 502 through a bore 512, to sliding gas supply tube 508, to the gas connection 506, to the movable gas supply inlet tube 504.

A flexible bellows 524, which can be rubber, plastic, metal or other suitably flexible material, covers the sliding gas supply tube 508 and the movable gas supply inlet tube 504. A linear drive 526 moves drive shaft 530 at a controlled speed. The drive shaft 530 is connected to the drive plate 528 whereby when the drive shaft 530 is moved, the drive plate 528, the moveable gas supply inlet tube 504 and the sliding gas supply tube 508 move.

An embodiment of the movable connection wherein the drive shaft 530 and the movable gas supply tube 504 are in-line is shown in FIG. 9B. Components that are similar to those in the embodiment in FIG. 9A are numbered the same.

Figure 9C:
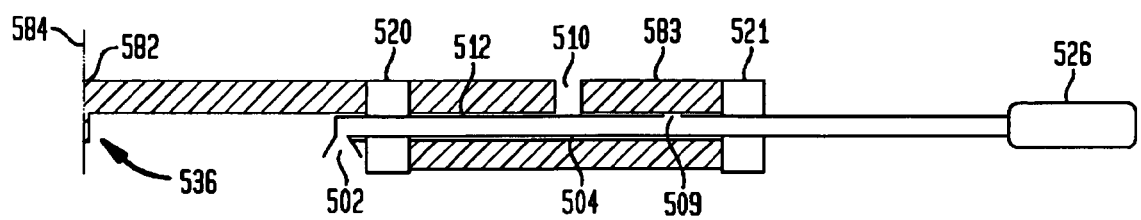
FIG. 9C is a partial cross-sectional view of a further embodiment of the present invention with a sliding tube coupling for the movable gas inlet.

A further embodiment of the movable connection with a straight tube configuration is shown in FIG. 9C.

The movable gas inlet 502 moves along a movable gas inlet slide channel or slot 536 in body 582. Inlet 502 is connected to the movable gas supply inlet tube 504 which passes through a first gas bearing 520, and extends in a bore 512 in an extension 583 of body 582. Tube 504 extends through a second gas bearing 521. A drive 526 is connected to the movable gas supply tube 504. Tube 504 has a port 509 disposed within bore 512, between bearings 520 and 521. The gas supply is fluid communication with the movable gas inlet through a gas inlet port 510 which communicates with bore 512, and thus communicates with movable gas supply tube 504 through port 509.

With the straight tube configuration as well as other configurations, the drive 526 can rotate as well as move linearly the movable gas supply tube 504 and thereby rotate the movable gas inlet 502 about its axis when desired. The rotation of the movable gas inlet 502 enables the direction of discharge of the gas flow from the movable gas inlet 502 to be varied dynamically as the movable inlet sweeps back and forth, towards and away from central axis 584. The angle may be set at a predetermined amount for the entire path of movement, at different amounts for different sweeps, or may be varied during a single movement along the path.

Figure 10:
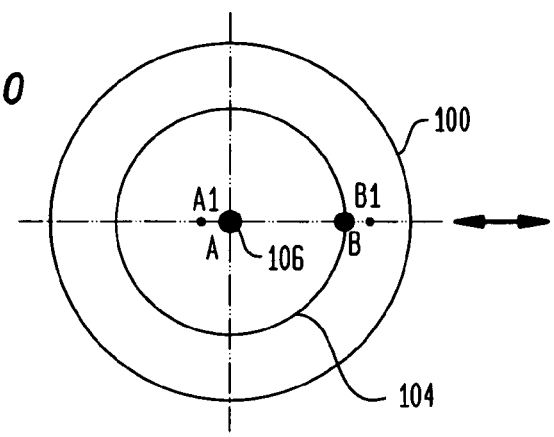
FIG. 10 is a top view of relative positions of the moveable gas inlet.

The position of the movable gas inlet is shown schematically in FIG. 10 relative to a rotating substrate carrier 104 having an axis of rotation 106 coincident with position A. Note that position A is disposed on the opposite side of axis 106 from point B and from the main path of the moving injector, between points A and B. Also, point B is disposed radially outboard of the edge of the substrate carrier 104. FIG. 10 is to be used as a reference for the positions identified in FIGS. 11A, 11B & 11C and in FIGS. 12A, 12B, 12C & 12D.

Figure 11A:
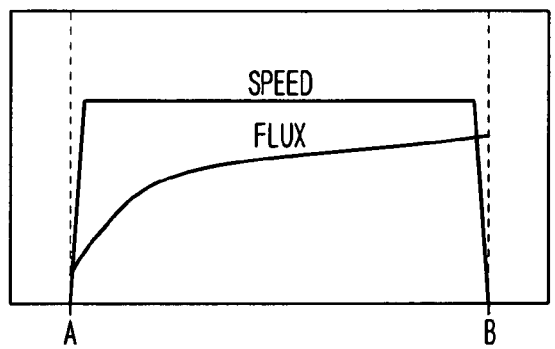
FIGS. 11A, 11B & 11C are graphical views of various embodiments of uniformity control schemes.

A graphical representation of one scheme for deposition uniformity control using a movable gas inlet is shown in FIG. 11A. With this particular scheme for deposition uniformity control the linear speed of the movable gas inlet is kept constant between position A and position B except for start and stop end positions while the flux of the first gas from the movable gas inlet is increased from the inner position A to the outer position B. In this scheme, the increasing flux compensates for the increase in surface area at the periphery of the rotating carrier.

Figure 11B:
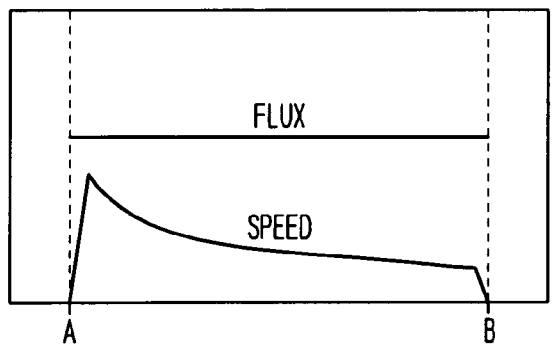

Another graphical representation of another scheme for deposition uniformity control using a movable gas inlet is shown in FIG. 11B. With this particular scheme for deposition uniformity control the first gas flux from the movable gas inlet is kept constant between position A and position B while the linear speed of the movable gas inlet after starting up is ramped down from position A to position B. In this arrangement, the slower radial speed of the moving inlet compensates for the increase in surface area at the periphery of the substrate carrier.

Figure 11C:
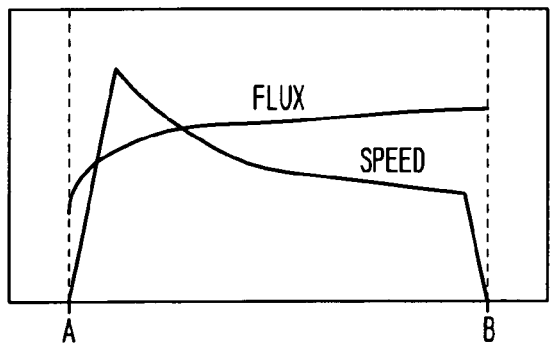

A graphical representation of a yet another scheme for deposition uniformity control is shown in FIG. 11C. With this particular scheme for deposition uniformity control the flux of the first gas from the movable gas inlet is increased from the inner position A to the outer position B while the linear speed of the movable gas inlet after starting is ramped down from position A to position B. Both speed and flux tend to compensate for the increase in surface area at the periphery of the substrate carrier.

In addition to the various schemes for deposition uniformity control illustrated in FIGS. 11A, 11B & 11C where the linear speed of the movable gas inlet and the first gas flux are varied or kept constant, the first gas flow can be modulated on & off (pulsed) providing a discrete flow injection across the radius. This pulsed modulation can be provided by using a fast-acting valve to shut off the first gas flow from the movable gas inlet. In addition to controlling the linear speed of the movable gas inlet over the radial path of movement, the speed and thus the direction of travel can be reversed at various positions between A and B, thus looping the travel of the movable gas inlet over a desired portion of the radial path. The various schemes for deposition uniformity control are not mutually exclusive and may be used in various combinations and permutations.

Figure 12A:
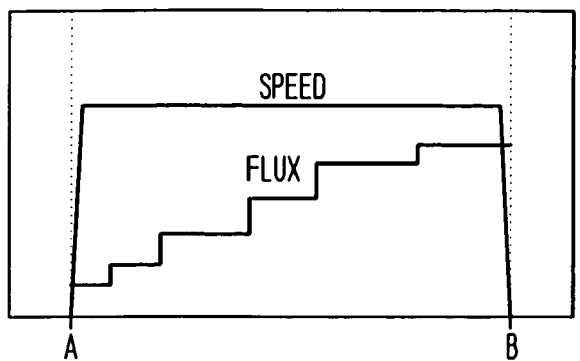
FIGS. 12A, 12B, 12C & 12D are graphical views of various embodiments of multi-zone uniformity control schemes.

A graphical representation for a scheme for multi-zone deposition uniformity control for the movable gas inlet of the present invention is shown in FIG. 12A. With this particular scheme the linear speed of the movable gas inlet is kept constant between position A and position B except for start and stop end positions while the flux of the first gas from the movable gas inlet is increased in predetermined step increments from the inner position A to the outer position B.

Figure 12B:
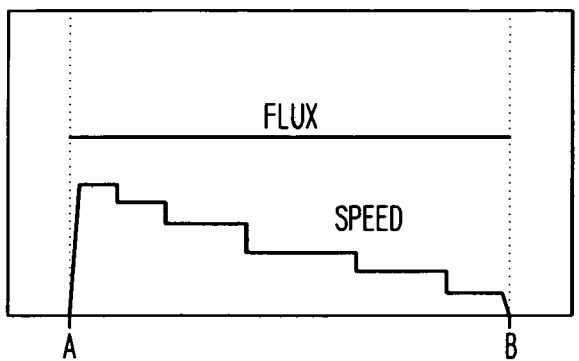

A graphical representation of another scheme for multi-zone deposition uniformity control for the movable gas inlet of the present invention is shown in FIG. 12B. With this particular scheme the linear speed of the movable gas inlet is decreased stepwise between position A and position B except for start and stop end positions while the flux of the first gas from the movable gas inlet is constant between the inner position A to the outer position B.

Figure 12C:
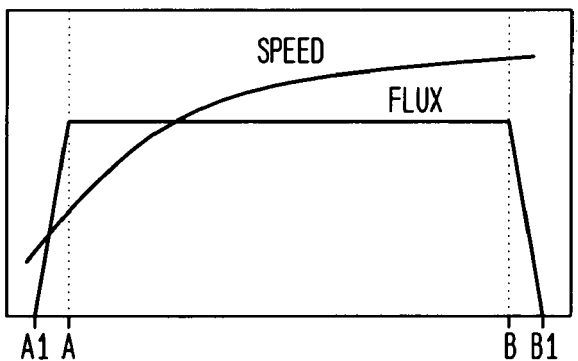

A graphical representation of yet another scheme for multi-zone deposition uniformity control for the movable gas inlet of the present invention is shown in FIG. 12C. With this particular scheme the flux of the first gas from the movable gas inlet is rapidly increased between position A1 (on the opposite side of axis of rotation 106) and radial position A, kept constant between the inner position A to the outer position B, then rapidly decreased from position B to position B1. The linear speed of the movable gas inlet is increased between inner position A1 and outer position B.

Figure 12D:
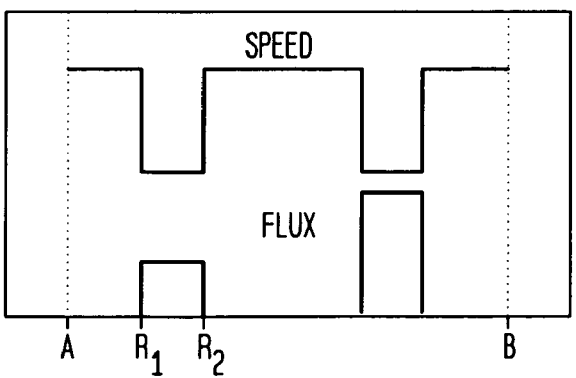

A graphical representation of a further scheme for multi-zone deposition uniformity control for the movable gas inlet of the present invention is shown in FIG. 12D. With this particular scheme the linear speed of the movable gas inlet is constant and the flux of the first gas from the movable gas inlet is minimal or zero until the movable gas inlet reaches a predetermined radial position $R_1$. At this point, the outward movement slows down stepwise and the flux of the first gas increases stepwise. Essentially the movable gas inlet moves rapidly with the first gas flux at zero, then when the movable gas inlet reaches a predetermined radial position $R_1$, its linear speed significantly slows and an impulse like burst of the first gas occurs with a stepwise flux increase until the movable gas inlet reaches a predetermined burst end radial position $R_2$. At that that position the first gas burst ends with the first gas flux going to zero and the linear speed of the movable gas inlet increases stepwise. This sequence is shown repeated at a different radial position and may be for the same duration and at a different or similar flux rate. The duration of the burst may be narrower (approaching a momentary pulse) or broader, depending upon the particular application.

In addition to the various schemes for deposition uniformity control herein described the direction of discharge of the gas flow from the movable gas inlet can be varied during the path of motion.

Figure 13:
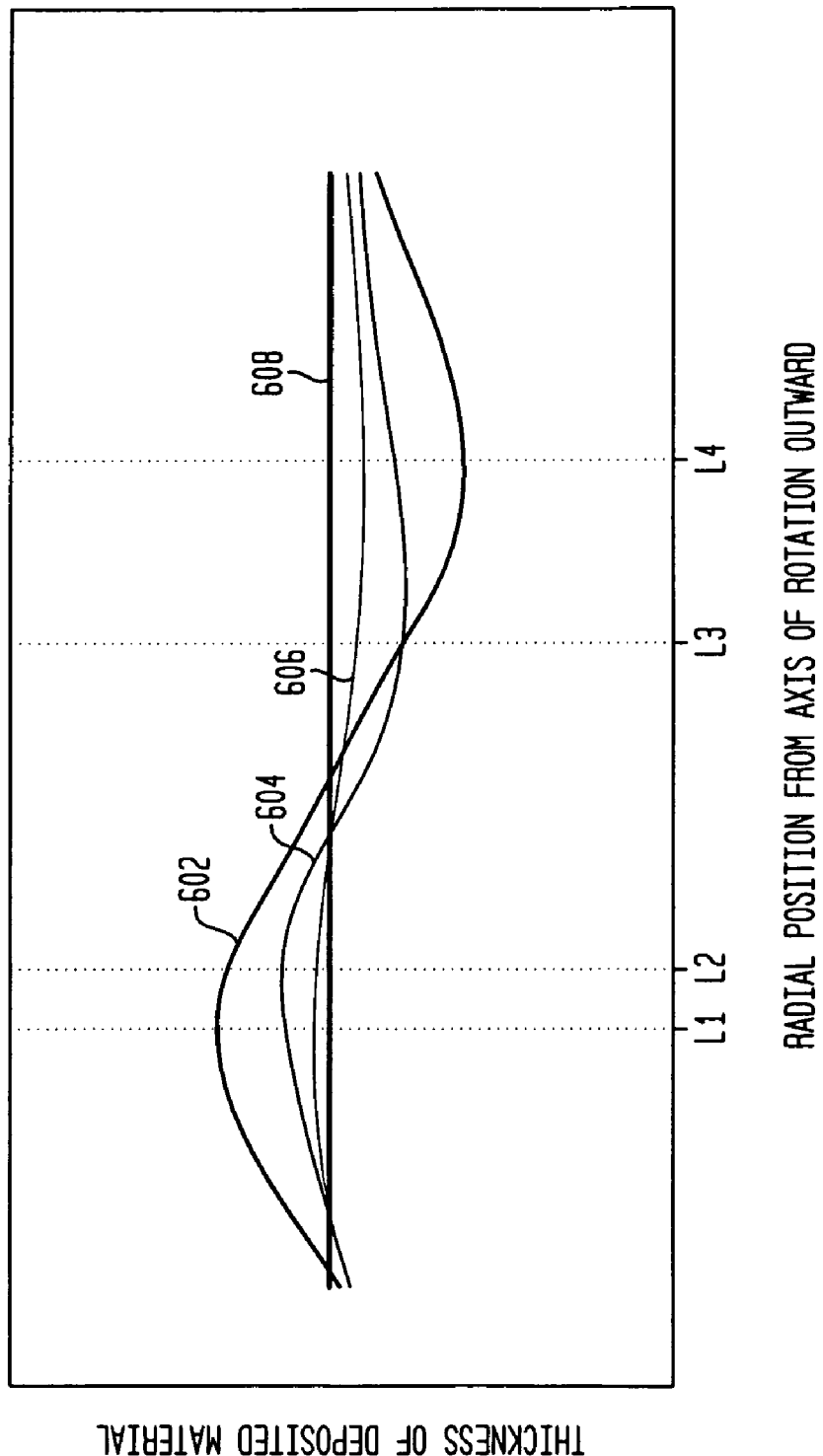
FIG. 13 is a graphical view of uniformity distribution for various schemes.

A graphical representation of uniformity distribution for the thickness of deposited material is shown in FIG. 13 where the vertical axis represents the thickness of deposited material on the substrate and the horizontal axis represents a corresponding radial position from the axis of rotation outward to the edge of the carrier. Operation of the reactor using three radially-offset zones of fixed first gas inlets, and with uniform movement speed and flux from the movable first gas outlet, result in the thickness of deposited material represented by the first iteration curve 602 with the average thickness of deposited material represented by line 608. An "ideal" deposition would have the thickness represented by line 608. The greatest deviations for the first iteration curve 602 from the average thickness 608 are seen at positions L1 and L4. By reducing the first gas flux discharged from the movable first gas inlet and/or increasing the linear speed of the movable first gas inlet near positions L1 and L2, and increasing the first gas flux discharged from the movable first gas inlet and/or decreasing the linear speed of the movable first gas inlet at rear position L3, a new distribution for thickness of deposited material uniformity is obtained and is represented by second iteration curve 604. Smaller deviations from the average thickness 608 can be seen, which are also shifted in radial position. Further tuning and adjusting of the movable gas inlet will result in a new distribution for the thickness of deposited material uniformity is obtained and is represented by the third iteration curve 606 which has even smaller deviations from the average thickness 608 which are also shifted in position.

In the foregoing embodiments, the gas treatment process involves metalorganic chemical vapor depositions. The processes and apparatus discussed above can be used to deposit compound semiconductors other than the III-V semiconductors mentioned above. For example, the processes and apparatus discussed above can be used to deposit II-VI semiconductors as, for example, oxide semiconductors. Moreover, the features discussed herein can be applied in other gas treatment processes such as other chemical deposition processes, gas etching, and the like.

Also, in the embodiments discussed above, the movable injectors move in a plane which is perpendicular to the axis of rotation of the substrate carrier. However, this is not essential; the movable injectors can move in paths which are inclined relative to the axis of rotation.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An injector head for a rotating disk gas treatment reactor having a reaction chamber and a substrate carrier adapted to carry one or more substrates within the chamber rotatable about an axis of rotation, the injector head comprising:
   (a) a body having a central axis, the body being adapted for mounting to the reaction chamber with the central axis coincident with the axis of rotation of the substrate carrier, the body including:
      (i.) fixed first gas inlets connected to a source of a first gas, the fixed first gas inlets being arranged to discharge the first gas into the reaction chamber at fixed locations with a component of motion in the downstream direction toward the carrier and substrates;
      (ii.) fixed second gas inlets connected to a source of a second gas reactive with the first gas, the fixed second gas inlets being arranged to discharge the second gas into the reaction chamber at fixed locations with a component of motion in the downstream direction toward the carrier and substrates so that the first and second gases react with one another and form a deposit on the substrates;
   (b) at least one first movable gas inlet for discharging the first gas with a component of motion in a downstream direction towards the carrier and substrates, the first movable gas inlet being movable relative to the body with a component of motion towards or away from the central axis.

2. The injector head as recited in claim 1, further comprising a drive for moving the at least one first movable gas inlet.

3. The injector head as recited in claim 2 wherein the drive moves the at least one first movable gas inlet in two opposite directions.

4. The injector head as recited in claim 1, further comprising another gas inlet for discharging a gas with a component of motion in a downstream direction towards the carrier wherein the first movable gas inlet is within the gas discharge from the another gas inlet.

5. The injector head as recited in claim 1 wherein the at least one first movable gas inlet is linearly movable with respect to the body.

6. The injector head as recited in claim 5 wherein the at least one first movable gas inlet is movable with respect to the head along a path of motion which is radial with respect to the central axis.

7. The injector head as recited in claim 6 wherein the path of motion of the at least one first movable gas inlet extends through the central axis.

8. The injector head as recited in claim 1 wherein the at least one first movable gas inlet is movable with respect to the head in an arcuate path of motion.

9. The injector head as recited in claim 8 wherein the arc is aligned with the central axis.

10. The injector head as recited in claim 9 wherein the at least one first movable gas inlet is aligned such that the arcuate movement extends through the central axis.

11. The injector head as recited in claim 1 further comprising another gas inlet near the at least one movable gas inlet and moving along with the at least one first movable gas inlet and the another gas inlet moves with the movement of the at least one first movable gas inlet.

12. The injector head as recited in claim 11 wherein the another gas inlet is mechanically coupled to the at least one first movable gas inlet.

13. The injector head as recited in claim 12 wherein the another gas inlet surrounds the at least one first movable gas inlet.

14. The injector head as recited in claim 13 wherein the another gas inlet is coaxial with the at least one first movable gas inlet.

15. The injector head as recited in claim 1 further comprising a second movable gas inlet for discharging a gas with a component of motion in the downstream direction towards the substrates.

16. The injector head as recited in claim 15 wherein the second movable gas inlet moves along with the at least one first movable gas inlet.

17. The injector head as recited in claim 16 wherein the second movable gas inlet is mechanically coupled to the at least one first movable gas inlet.

18. The injector head as recited in claim 1 comprising a mechanism for varying the direction of discharge of first gas flow of the at least one first movable gas inlet.

19. The injector head as recited in claim 1 further comprising a reflector aligned to direct light reflected from the surface of the substrate and an optical sensor aligned to detect the light reflected by the reflector, wherein the reflector moves with the movement of the at least one first movable gas inlet.

20. The injector head as recited in claim 19 wherein the reflector is mechanically coupled to the at least one first movable gas inlet.

21. The injector head as recited in claim 19 further comprising a circuit for calculating the growth rate of the substrates, the circuit linked to the optical sensor.

22. The injector head as recited in claim 19 further comprising a circuit for calculating composition of the substrates, the circuit linked to the optical sensor.

23. The injector head as recited in claim 19 further comprising a circuit for calculating absolute reflectivity of the substrates, the circuit linked to the optical sensor.

24. A rotating disk gas reactor for treating one or more substrates, the reactor comprising:
  (a) a reaction chamber;
  (b) a carrier mounted within said chamber for rotation therein about an axis of rotation, the carrier adapted to carry one or more substrates;
  (c) a carrier drive for rotating the carrier around the axis of rotation;
  (d) a source of a first gas and fixed first gas inlets connected to the source of the first gas, the fixed first gas inlets being arranged to discharge the first gas into the reaction chamber at fixed locations with a component of motion in the downstream direction toward the carrier and substrates;
  (e) a source of a second gas reactive with the first gas and fixed gas second inlets connected to the source of the second gas, the fixed second gas inlets being arranged to discharge the second gas into the reaction chamber at fixed locations with a component of motion in the downstream direction toward the carrier and substrates so that the first and second gases react with one another and form a deposit on the substrates;
  (f) at least one first movable gas inlet connected to the source of the first gas for discharging the first gas with a component of motion in the downstream direction towards the substrates; and,
  (g) an inlet drive adapted for moving the at least one first movable gas inlet with a component of motion towards or away from the axis of rotation.

25. The reactor as recited in claim 24 wherein the inlet drive comprises a linear motion drive for moving the at least one first movable gas inlet linearly.

26. The reactor as recited in claim 25 wherein the inlet drive and the at least one first movable gas inlet are aligned such that the at least one first movable gas inlet's linear movement is radial with respect to the axis of rotation.

27. The reactor as recited in claim 26 wherein the inlet drive and the at least one first movable gas inlet are aligned such that the at least one first movable gas inlet's linear movement extends through the axis of rotation.

28. The reactor as recited in claim 24 wherein the inlet drive is adapted for moving the at least one first movable gas inlet in an arc.

29. The reactor as recited in claim 28 wherein the inlet drive and the at least one first movable gas inlet are arranged such that the arc is aligned with the axis of rotation.

30. The reactor as recited in claim 29 wherein the inlet drive and the at least one first movable gas inlet are arranged such that the arcuate movement extends through the axis of rotation.

31. The reactor as recited in claim 24 wherein the inlet drive moves the at least one first movable gas inlet in two opposite directions.

32. The reactor as recited in claim 24 further comprising another gas inlet near the at least one movable gas inlet and moving along with the at least one first movable gas inlet.

33. The reactor as recited in claim 32 wherein the another gas inlet surrounds the at least one first movable gas inlet.

34. The reactor as recited in claim 33 wherein the another gas inlet is coaxial with the at least one first movable gas inlet.

35. The reactor as recited in claim 24 further comprising a second movable gas inlet for discharging the second gas with a component of motion in the downstream direction towards the substrates.

36. The reactor as recited in claim 35 wherein the second movable gas inlet moves along with the at least one first movable gas inlet.

37. The reactor as recited in claim 36 wherein the second movable gas inlet is mechanically coupled to the at least one first movable gas inlet.

38. The reactor as recited in claim 24 further comprising a mechanism for varying the direction of discharge of first gas flow of the at least one first movable gas inlet.

39. The reactor as recited in claim 24 further comprising a reflector aligned to direct light reflected from the surface of the substrates and a sensor aligned to intercept the directed light, wherein the reflector moves with the movement of the at least one first movable gas inlet.

\* \* \* \* \*

UNITED STATES PATENT AND TRADEMARK OFFICE
CERTIFICATE OF CORRECTION

PATENT NO. : 8,092,599 B2  
APPLICATION NO. : 11/827133  
DATED : January 10, 2012  
INVENTOR(S) : Piero Sferlazzo et al.

Page 1 of 1

It is certified that error appears in the above-identified patent and that said Letters Patent is hereby corrected as shown below:

Title Page:  
(57) Abstract, third line, "system is" should read -- system are --.

In the Specifications:  
Column 3, line 51, "chamber in" should read -- chamber is --.  
Column 3, line 56, "rate affect" should read -- rate affects --.  
Column 3, line 62, "disc like" should read -- disc-like --.  
Column 4, line 45, "108 is" should read -- First movable gas inlet 108 is --.  
Column 5, line 14, "second gasses" should read -- second gases --.  
Column 5, line 15, "The gasses" should read -- The gases --.  
Column 5, line 17, "As the gasses" should read -- As the gases --.  
Column 5, line 20, "second gasses" should read -- second gases --.  
Column 5, line 23, "gasses such" should read -- gases such --.  
Column 5, line 41, "second gasses" should read -- second gases --.  
Column 6, line 40, "gasses and" should read -- gases and --.  
Column 6, line 64, "range from" should read -- ranges from --.  
Column 7, line 11, "is shown" should read -- as shown --.  
Column 7, line 33, "D, are" should read -- D, and is --.  
Column 7, line 49, "second gasses" should read -- second gases --.  
Column 8, line 12, "surface moves" should read -- surface move --.  
Column 8, line 38, "gas loses" should read -- gas losses --.  
Column 9, line 28, "is fluid" should read -- is in fluid --.  
Column 10, line 18, "& off" should read -- and off --.  
Column 10, line 66, "impulse like" should read -- impulse-like --.

Signed and Sealed this  
Ninth Day of April, 2013

Teresa Stanek Rea  
*Acting Director of the United States Patent and Trademark Office*